US010847352B2

(12) United States Patent
Agarwal et al.

(10) Patent No.: US 10,847,352 B2
(45) Date of Patent: Nov. 24, 2020

(54) COMPENSATING CHAMBER AND PROCESS EFFECTS TO IMPROVE CRITICAL DIMENSION VARIATION FOR TRIM PROCESS

(71) Applicant: LAM RESEARCH CORPORATION, Fremont, CA (US)

(72) Inventors: Pulkit Agarwal, Beaverton, OR (US); Adrien Lavoie, Newberg, OR (US); Ravi Kumar, Providence, RI (US); Purushottam Kumar, Hillsboro, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 215 days.

(21) Appl. No.: 16/053,022

(22) Filed: Aug. 2, 2018

(65) Prior Publication Data

US 2020/0043709 A1 Feb. 6, 2020

(51) Int. Cl.
*H01J 37/32* (2006.01)
*C23C 16/455* (2006.01)

(52) U.S. Cl.
CPC .. *H01J 37/32926* (2013.01); *C23C 16/45536* (2013.01); *C23C 16/45544* (2013.01);
(Continued)

(58) Field of Classification Search
CPC .......... C23C 16/0245; C23C 16/45536; C23C 16/45544; C23C 16/52; C23C 16/505;
(Continued)

(56) References Cited

U.S. PATENT DOCUMENTS

| 4,166,783 A | 9/1979 | Turner |
| 2001/0014540 A1 | 8/2001 | Shan et al. |
| 2016/0284534 A1 | 9/2016 | Kim et al. |

FOREIGN PATENT DOCUMENTS

| JP | 2002319571 A | 10/2002 |
| KR | 20070000279 A | 1/2007 |

OTHER PUBLICATIONS

International Search Report and Written Opinion corresponding to International Application No. PCT/US2019/044343 dated Nov. 27, 2019, 9 pages.

*Primary Examiner* — Yuechuan Yu
(74) *Attorney, Agent, or Firm* — Harness, Dickey & Pierce, P.L.C.

(57) ABSTRACT

A controller includes memory that stores data correlating accumulation values to respective adjustment factors. The accumulation values correspond to accumulation of material on surfaces within a processing chamber and the respective adjustment factors correspond to adjustments to a control parameter of RF power provided to the processing chamber. An accumulation calculation module is configured to calculate a first accumulation value indicating an amount of accumulation of the material. An RF power control module is configured to receive the first accumulation value, receive at least one of a setpoint power and a duration of an etching step, retrieve the stored data from the memory, adjust the control parameter based on the first accumulation value, the at least one of the setpoint power and the duration of the etching step, and the stored data, and control the RF power provided to the processing chamber in accordance with the adjusted control parameter.

11 Claims, 9 Drawing Sheets

(52) U.S. Cl.
CPC .. *H01J 37/32183* (2013.01); *H01J 37/32449* (2013.01); *H01J 37/32458* (2013.01); *H01J 2237/334* (2013.01); *H01J 2237/3321* (2013.01)

(58) Field of Classification Search
CPC ........... H01J 37/32449; H01J 37/32183; H01J 37/32926; H01J 37/32458; H01J 2237/334; H01J 2237/3321
See application file for complete search history.

COMPENSATING CHAMBER AND PROCESS EFFECTS TO IMPROVE CRITICAL DIMENSION VARIATION FOR TRIM PROCESS

FIELD

The present disclosure relates to double patterning processes in an atomic layer deposition substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more process gases may be delivered by a gas delivery system to the processing chamber. In some systems, the gas delivery system includes a manifold connected by one or more conduits to a showerhead that is located in the processing chamber. In some examples, the process deposits a thin film on a substrate using atomic layer deposition (ALD).

SUMMARY

A controller includes memory that stores data correlating accumulation values to respective adjustment factors. The accumulation values correspond to accumulation of material on surfaces within a processing chamber configured to perform etching and deposition on a substrate, and the respective adjustment factors correspond to adjustments to a control parameter of radio frequency (RF) power provided to the processing chamber while performing an etching step of a patterning process. An accumulation calculation module is configured to calculate a first accumulation value indicating an amount of accumulation of the material. An RF power control module is configured to receive the first accumulation value, receive at least one of a setpoint power to be provided during the etching step and a duration of the etching step, retrieve the stored data from the memory, adjust the control parameter based on the first accumulation value, the at least one of the setpoint power and the duration of the etching step, and the stored data, and control the RF power provided to the processing chamber during the etching step in accordance with the control parameter as adjusted.

In other features, the control parameter is a magnitude of the RF power and the RF power control module is configured to determine a first adjustment factor corresponding to the first accumulation value using the stored data and adjust the magnitude of the RF power in accordance with the first adjustment factor. The stored data is a polynomial correlating the accumulation values to the respective adjustment factors. The first adjustment factor is a ratio of a magnitude of an RF power required to compensate for the accumulation to the setpoint power. The RF power control module is configured to multiply the setpoint power by the first adjustment factor to adjust the control parameter.

In other features, the accumulation calculation module is configured to calculate the first accumulation value based on at least one of a number of etching steps performed within the processing chamber, a number of cycles of etching steps and deposition steps performed within the processing chamber, a total duration of etching steps and deposition steps performed within the processing chamber, and a number of substrates processed within the processing chamber.

In other features, the control parameter is the duration of the etching step and the RF power control module is configured to determine a first adjustment factor corresponding to the first accumulation value using the stored data and adjust the duration of the etching step in accordance with the first adjustment factor. The first adjustment factor corresponds to an amount to increase the duration of the etching step to compensate for the accumulation. The RF power control module is configured to multiply the duration of the etching step by the first adjustment factor to adjust the control parameter. The etching step is a trim step. A system includes the controller and the controller is further configured to perform a spacer layer deposition step within the processing chamber subsequent to the trim step.

A method includes storing data correlating accumulation values to respective adjustment factors. The accumulation values correspond to accumulation of material on surfaces within a processing chamber configured to perform etching and deposition on a substrate, and the respective adjustment factors correspond to adjustments to a control parameter of radio frequency (RF) power provided to the processing chamber while performing an etching step of a patterning process. The method further includes calculating a first accumulation value indicating an amount of accumulation of the material, receiving at least one of a setpoint power to be provided during the etching step and a duration of the etching step, adjusting the control parameter based on the first accumulation value, the at least one of the setpoint power and the duration of the etching step, and the stored data and controlling the RF power provided to the processing chamber during the etching step in accordance with the control parameter as adjusted.

In other features, the control parameter is a magnitude of the RF power and the method further includes determining a first adjustment factor corresponding to the first accumulation value using the stored data and adjusting the magnitude of the RF power in accordance with the first adjustment factor. The stored data is a polynomial correlating the accumulation values to the respective adjustment factors. The first adjustment factor is a ratio of a magnitude of an RF power required to compensate for the accumulation to the setpoint power. The method further includes multiplying the setpoint power by the first adjustment factor to adjust the control parameter.

In other features, the method further includes calculating the first accumulation value based on at least one of a number of etching steps performed within the processing chamber, a number of cycles of etching steps and deposition steps performed within the processing chamber, a total duration of etching steps and deposition steps performed within the processing chamber, and a number of substrates processed within the processing chamber.

In other features, the control parameter is the duration of the etching step and the method further includes determining a first adjustment factor corresponding to the first accumulation value using the stored data and adjusting the duration of the etching step in accordance with the first adjustment factor. The first adjustment factor corresponds to an amount to increase the duration of the etching step to compensate for the accumulation. The etching step is a trim step and the method further includes performing a spacer layer deposition step within the processing chamber subsequent to the trim step.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In film deposition processes such as atomic layer deposition (ALD), various properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. In some examples, the NU may be reduced either by, for example, addressing a direct cause of the NU and/or introducing a counteracting NU to compensate and cancel the existing NU. In other examples, material may be intentionally deposited and/or removed non-uniformly to compensate for known non-uniformities at other (e.g. previous or subsequent) steps in a process.

Double patterning (DPT) ALD processes (e.g., a self-aligned double patterning, or SADP, process) may include steps including, but not limited to, a lithography step, a trim step, and a sacrificial spacer layer deposition step. Each step may have associated NUs affecting overall critical dimension (CD) NU and imbalance. For example, the trim step may be performed between the lithography step and the spacer layer deposition step to reduce the CD. However, trim NU may result in non-uniform double patterning, which increases CD imbalance and results in poor yield. Trim NU may be characterized as radial NU and azimuthal NU.

CD NU and imbalance for a particular substrate may be characterized as within wafer (WiW) variability. Conversely, CD NU and imbalance between different substrates may be characterized as wafer-to-wafer (WtW) variability. In DPT processes, minimizing WtW variability in CD NU and imbalance may be difficult. For example, the trim step and the subsequent spacer deposition step may be performed in a same processing chamber to increase processing throughout. Deposition steps may cause material to accumulate on surfaces (e.g., inner walls) within the processing chamber. Further, etch byproducts (e.g., byproducts of the trim step) may accumulate on surfaces of the processing chamber. This accumulation of material within the processing chamber changes an overall impedance of the processing chamber, which in turn affects etch rates. Accordingly, the accumulation of material and the resultant change in the impedance of the chamber increases WtW variability of the trim step.

Systems and methods according to the principles of the present disclosure are configured to reduce WtW etching variability (e.g., in a trim step) caused by accumulation of material on inner surfaces of the processing chamber. For example, the etch rate is further affected by radio frequency (RF) power provided to an electrode to generate plasma within the processing chamber. Accordingly, in one example, as the etch rate is reduced as a result of the accumulation, a control parameter of the RF power may be adjusted to compensate for the reduced etch rate. In one example, the control parameter is an amount (i.e., magnitude) of the RF power provided during the trim step. In other words, RF power may be adjusted to maintain desired etch rates and reduce variability caused by changes in the impedance of the processing chamber. In another example, the control parameter is a duration of the etching (e.g., a duration of the trim step), and the duration may be increased to compensate for the reduced etch rate.

Figure 1:
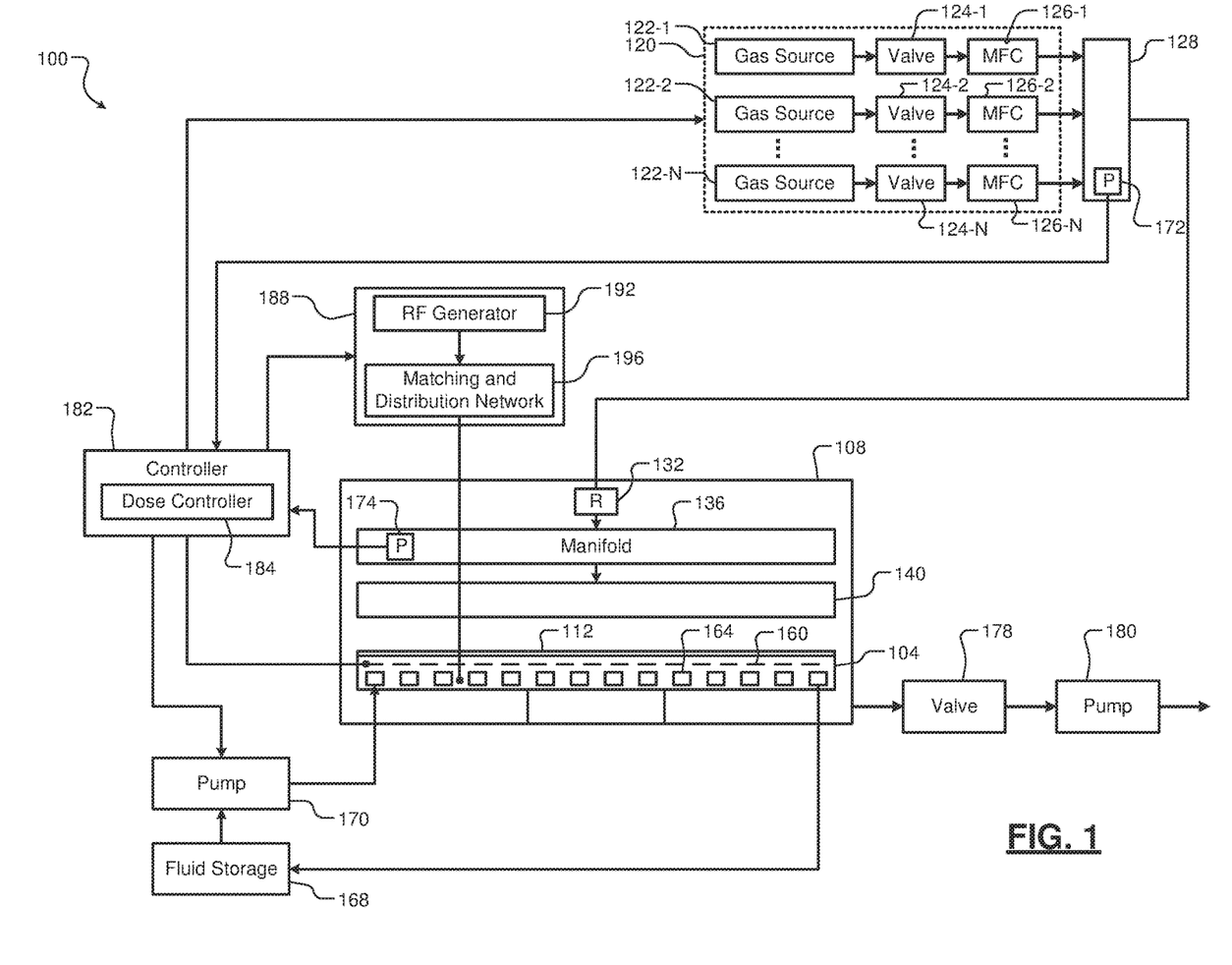
FIG. 1 is a functional block diagram of an example of a substrate processing system according to the present disclosure.

Referring now to FIG. 1, an example of a substrate processing system 100 including a substrate support (e.g., an ALD pedestal) 104 according to the present disclosure is shown. The substrate support 104 is arranged within a processing chamber 108. A substrate 112 is arranged on the substrate support 104 during processing.

A gas delivery system 120 includes gas sources 122-1, 122-2, . . . , and 122-N (collectively gas sources 122) that are connected to valves 124-1, 124-2, . . . , and 124-N (collectively valves 124) and mass flow controllers 126-1, 126-2, . . . , and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a gas distribution device such as a multi-injector showerhead 140. While the manifold 128 and 136 are shown, a single manifold can be used. The showerhead 140 according to the principles of the present disclosure is configured to be tilted during processing of the substrate 112 as described below in more detail.

In some examples, a temperature of the substrate support 104 may be controlled using resistive heaters 160. The substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature).

In some examples, the substrate processing system 100 may be configured to perform etching on the substrate 112 within the same processing chamber 108. For example, the substrate processing system 100 may be configured to perform both a trim step and a spacer deposition step according to the present disclosure as described below in more detail. Accordingly, the substrate processing system 100 may include an RF generating system 188 configured to generate and provide RF power (e.g., as a voltage source, current source, etc.) to one of a lower electrode (e.g., a baseplate of the substrate support 104, as shown) and an upper electrode (e.g., the showerhead 140). For example purposes only, the output of the RF generating system 188 will be described herein as an RF voltage. The other one of the lower electrode and the upper electrode may be DC grounded, AC grounded or floating. For example only, the RF generating system 188 may include an RF generator 192 configured to generate the RF voltage that is fed by a matching and distribution network 196 to generate plasma within the processing chamber 108 to etch the substrate 112. In other examples, the plasma may be generated inductively or remotely. Although, as shown for example purposes, the RF generating system 188 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

The controller 182 according to the present disclosure is further configured to adjust the RF power and/or a duration of an etching step (e.g., a trim step) to compensate for changes to etch rates caused by accumulation of material on surfaces within the processing chamber 108.

Figure 2A:
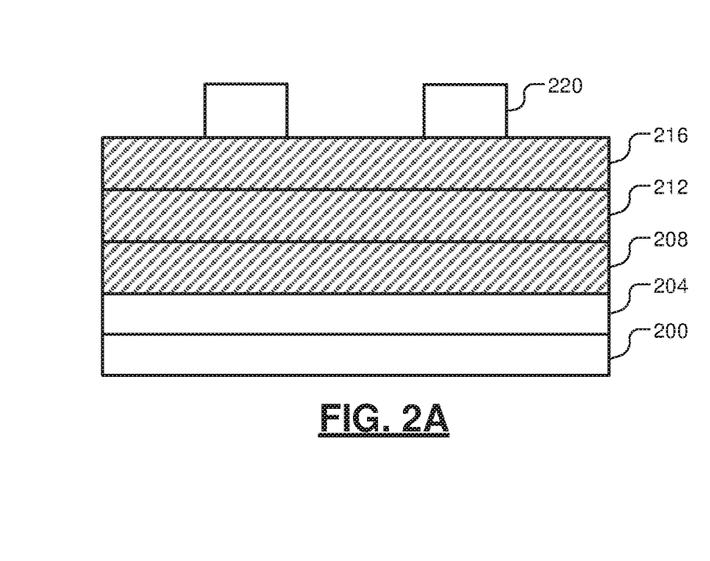
FIGS. 2A through 2K illustrate an example of a double patterning atomic layer deposition process according to the present disclosure.

Referring now to FIGS. 2A-2K, an example SADP process is described. FIG. 2A shows a substrate 200 including, for example, a hardmask layer 204 formed thereon. For example only, the substrate 200 includes a silicon (Si) substrate and the hardmask layer 204 is made of a silicon nitride ($Si_3N_4$), although other materials may be used. A plurality of core layers (e.g., mandrel layers) 208, 212, and 216 are deposited on the hardmask layer 204 (e.g., using chemical vapor deposition, or CVD). For example only, the core layers 208, 212, and 216 may include amorphous silicon (a-Si). In some examples, the core layers 208, 212, and 216 may have a height of approximately 50-150 nm (e.g., 100 nm). A patterning layer (e.g., a patterned photoresist layer or mask) 220 is formed on the core layer 216 and patterned using photolithography.

Figure 2B:
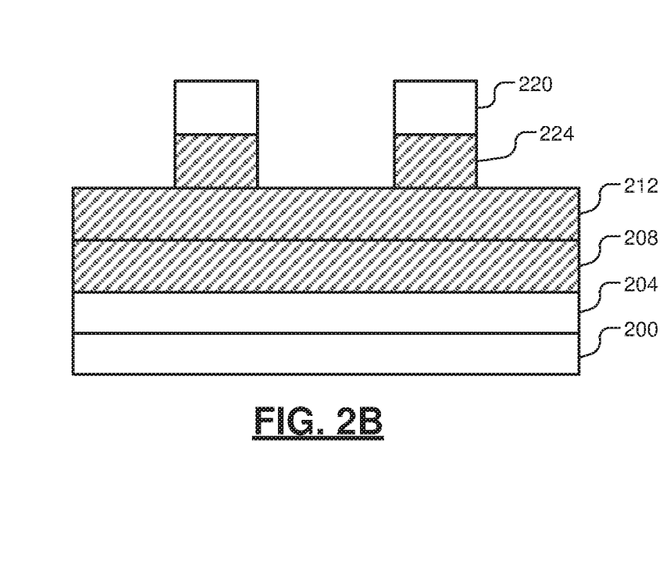

The substrate 200 including the hardmask layer 204, the core layers 208, 212, and 216, and the mask 220 is arranged within a processing chamber (e.g., an inductively coupled plasma chamber of an etch tool). As shown in FIG. 2B, the core layer 216 is etched (e.g., using an anisotropic etch or other process) to form a plurality of mandrels 224. The mask 220 protects the portions of the core layer 216 corresponding to the mandrels 224 during the etching of the core layer 216. If the mask 220 is a photoresist mask, the mask 220 can be removed with an oxygen containing plasma. If the mask 220 is of a material similar to a spacer layer 228 as described below, the mask 220 may remain on the mandrels 224 and may be etched during the etching of the spacer layer 228.

Figure 2C:
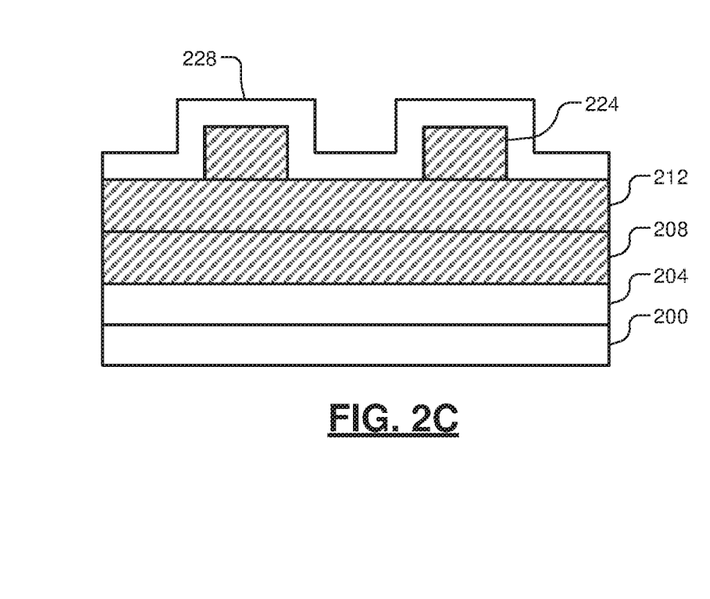

In FIG. 2C, the spacer layer 228 is deposited over the substrate 200 (i.e., on the core layer 212 and the mandrels 224). For example only, the spacer layer 228 may be conformally deposited using ALD, such as an oxide-type deposition (using precursors including silicon tetrachloride ($SiCl_4$), silane ($SiH_4$), etc.), a nitride-type deposition (using precursors including molecular nitrogen, ammonia ($NH_3$), etc.), and/or a carbon based deposition (using precursors including methane ($CH_4$), fluoromethane ($CH_3F$), etc.).

In one example, the spacer layer 228 is deposited using a $SiCl_4$ precursor in the presence of $O_2$. Other example process parameters for performing the deposition of the spacer layer 228 include temperature variation between a minimum temperature less than 10° C. up to 120° C., plasma power between 200 and 1800 W, a bias voltage from 0 to approximately 1000 volts, and a chamber pressure between 2 mTorr to 2000 mTorr.

In some examples, a trim step may be performed on the mandrels 224 prior to depositing the spacer layer 228. For example, in the trim step, the mandrels 224 may be etched to adjust widths of the mandrels 224 and dimensions of the spacer layer 228.

Figure 2D:
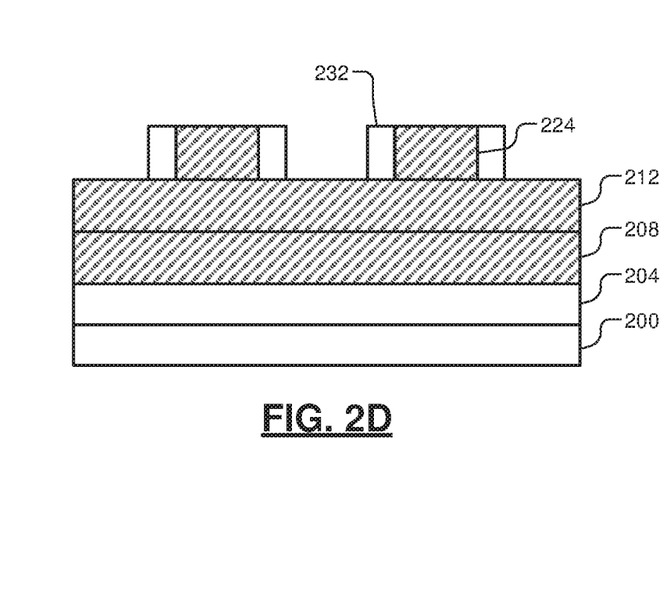
Figure 2E:
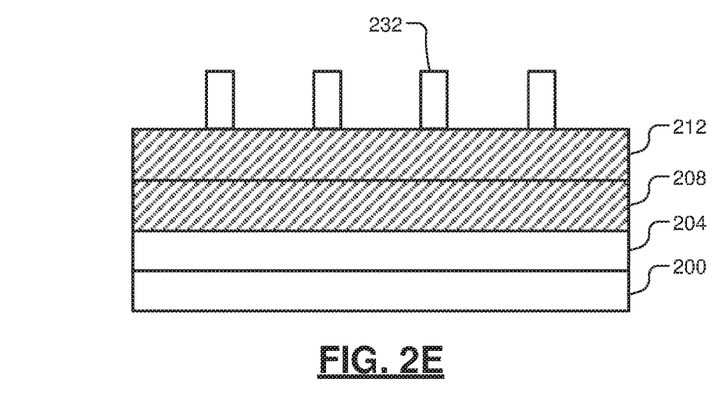

In FIG. 2D, the spacer layer 228 is etched (e.g., using an anisotropic etch process) to remove portions of the spacer layer 228 from the upper surfaces of the core layer 212 and the mandrels 224 while allowing sidewall portions 232 of the spacer layer 228 to remain. In some examples, a breakthrough step may be performed (e.g., a fluoride containing plasma treatment) subsequent to the etch described in FIG. 2D. Further, depending on the material of the spacer layer 228, an oxygen-containing plasma treatment may be performed prior to the fluoride containing plasma treatment. In FIG. 2E, the mandrels 224 are removed (e.g., using an anisotropic etch). Accordingly, the sidewall portions 232 remain formed on the substrate 200.

Figure 2F:
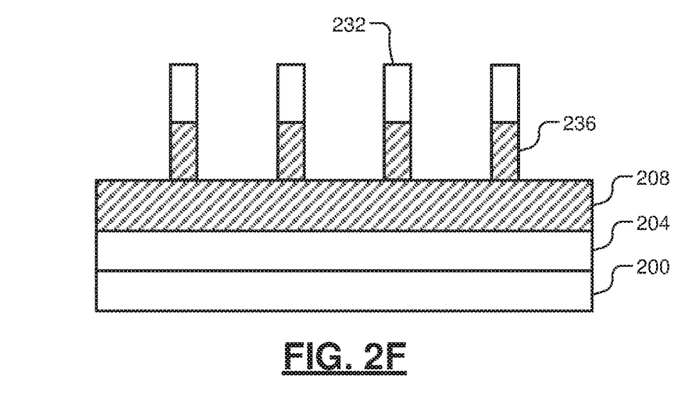

As shown in FIG. 2F, the core layer 212 is etched (e.g., using an anisotropic etch or other process) to form a plurality of mandrels 236. The sidewall portions 232 act as a mask to protect the portions of the core layer 212 corresponding to the mandrels 236 during the etching of the core layer 212. The sidewall portions 232 can be removed in an additional plasma etching step, during the etching of a spacer layer 240 as described below, etc.

Figure 2G:
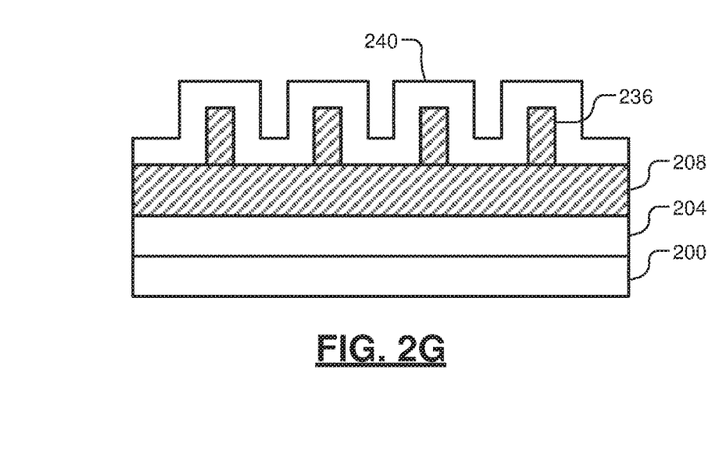

In FIG. 2G, the spacer layer 240 is deposited over the substrate 200 (i.e., on the core layer 208 and the mandrels 236). For example only, the spacer layer 240 may be conformally deposited using ALD in a manner similar to the spacer layer 228. In some examples, a trim step may be performed on the mandrels 236 prior to depositing the spacer layer 240.

Figure 2H:
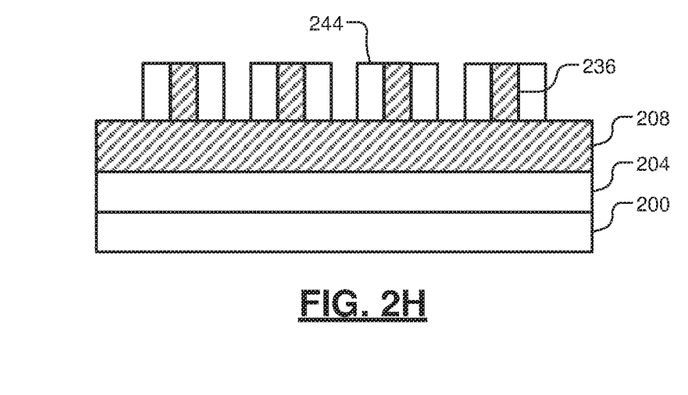
Figure 2I:
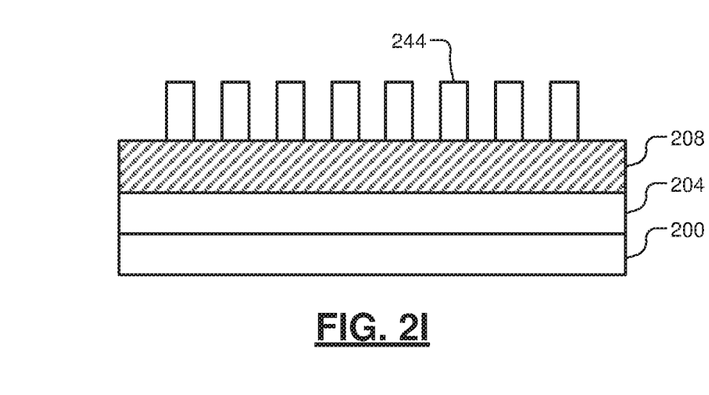

In FIG. 2H, the spacer layer 240 is etched (e.g., using an anisotropic etch process) to remove portions of the spacer layer 240 from the upper surfaces of the core layer 208 and the mandrels 236 while allowing sidewall portions 244 of the spacer layer 240 to remain. In some examples, a breakthrough step may be performed (e.g., a fluoride containing plasma treatment) subsequent to the etch described in FIG. 2H. Further, depending on the material of the spacer layer 240, an oxygen-containing plasma treatment may be performed prior to the fluoride containing plasma treatment. In FIG. 2I, the mandrels 236 are removed (e.g., using an anisotropic etch). Accordingly, the sidewall portions 244 remain formed on the substrate 200.

Figure 2J:
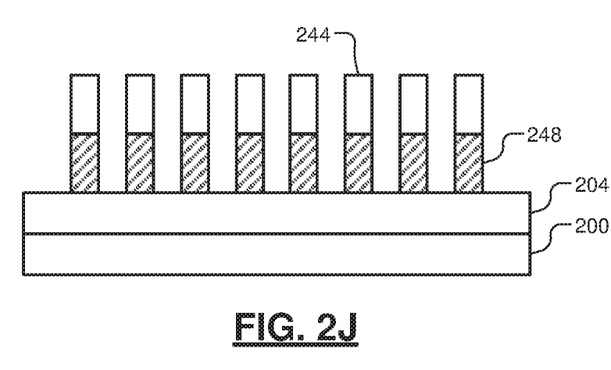

As shown in FIG. 2J, the core layer 208 is etched (e.g., using an anisotropic etch or other process) to form a plurality of mandrels 248. The sidewall portions 244 act as a mask to protect the portions of the core layer 208 corresponding to the mandrels 248 during the etching of the core layer 208. The sidewall portions 244 can be removed in, for example, an additional plasma etching step as shown in FIG. 2K.

Figure 2K:
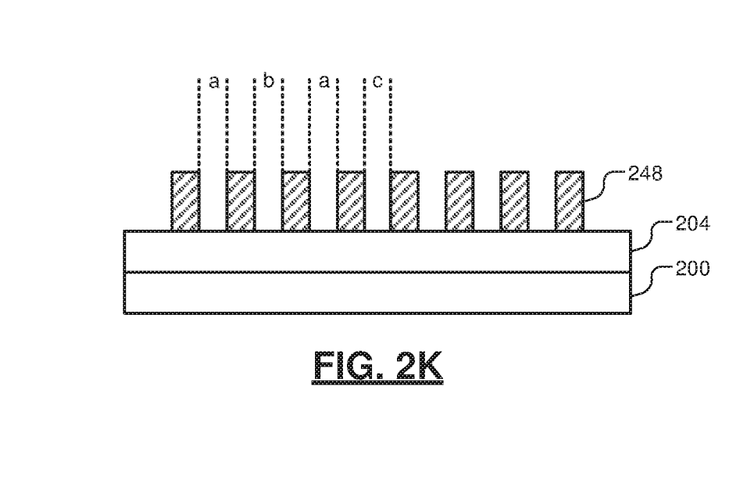

As shown in FIG. 2K, the SADP process results in the mandrels 248 formed on the substrate 200 (e.g., on the hardmask layer 204) in a spaced pattern. A spacing between the mandrels 248 is determined in accordance with a spacing between the sidewall portions 244 as shown in FIG. 2I, which is in turn determined in accordance with a spacing between the sidewall portions 232 as shown in FIG. 2E. Widths of the mandrels 236 and the mandrels 236 determine the respective spacing between the sidewall portions 44 and the sidewall portions 232 and, therefore, the spacing between the mandrels 248. Accordingly, the trim steps may be performed on the mandrels 236 and the mandrels 236 to ensure uniform spacing between the mandrels 248. For example, respective widths of the mandrels 236 and the mandrels 236 may be trimmed to achieve a uniform spacing such that a=b=c as shown in FIG. 2K.

Figure 3A:
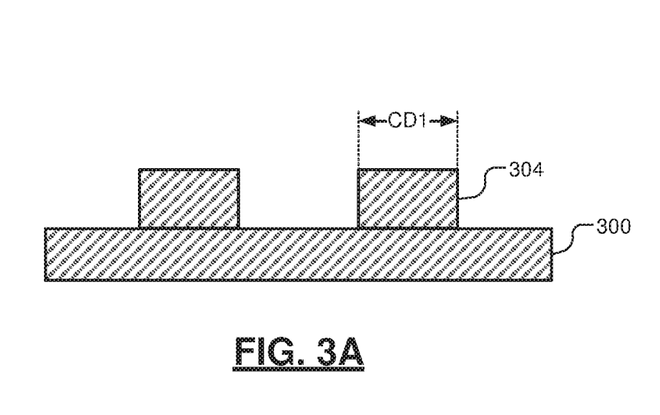
FIGS. 3A through 3D illustrate an example trim step of a self-aligned double patterning process according to the present disclosure.
Figure 3B:
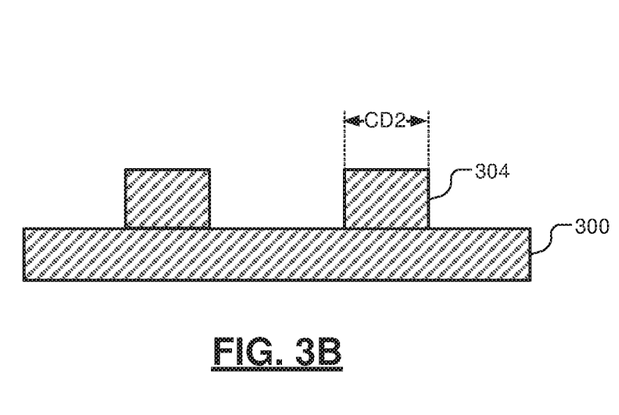
Figure 3C:
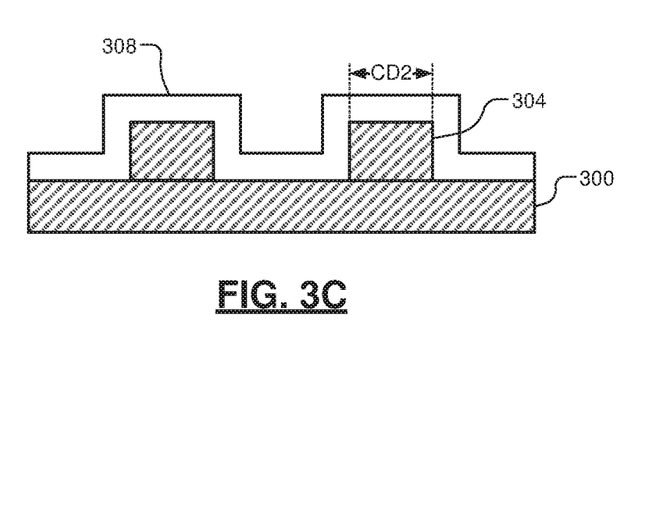

Referring now to FIGS. 3A, 3B, 3C, and 3D, an example trim step of an SADP process is described. For simplicity, only a single core layer 300 and mandrels 304 are shown. In FIG. 3A, the mandrels 304 are shown prior to a trim step (e.g., subsequent to an etching step to form the mandrels 304 on the core layer 300, such as shown in FIG. 2B). A width of the mandrels 304 corresponds to a critical dimension CD1. The mandrels 304 are trimmed (e.g., etched) as shown in FIG. 3B to adjust the width of the mandrels 304. Accordingly, the critical dimension of the mandrels 304 is reduced to CD2. In FIG. 3C, a spacer layer 308 is deposited (e.g., conformally deposited using ALD as described above) over the core layer 300 and the mandrels 304.

Figure 3D:
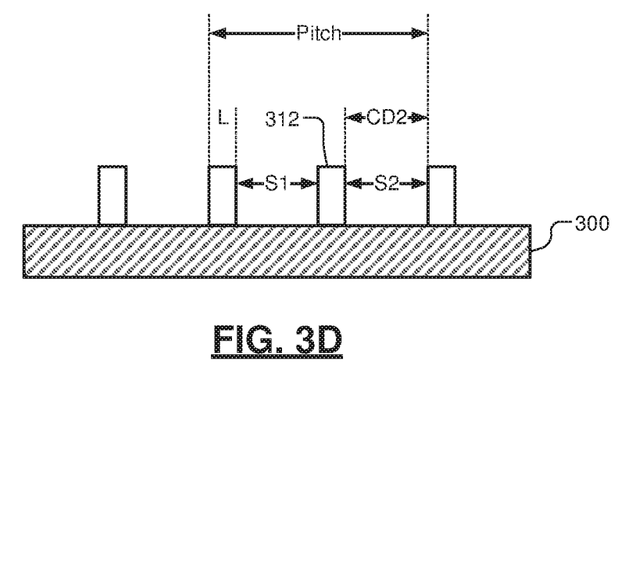

FIG. 3D shows sidewall portions 312 of the spacer layer 308 remaining on the core layer 300 subsequent to performing one or more etch steps to remove portions of the spacer layer 308 and the mandrels 304. Spaces (e.g., S1, S2, etc.) between the sidewall portions 312 correspond to respective widths (e.g., CD2) of the mandrels 304. Accordingly, a pitch of the sidewall portions 312 may be defined as S1+S2+2L, where L corresponds to a line width (i.e., a width of one of the sidewall portions 312.

Figure 4:
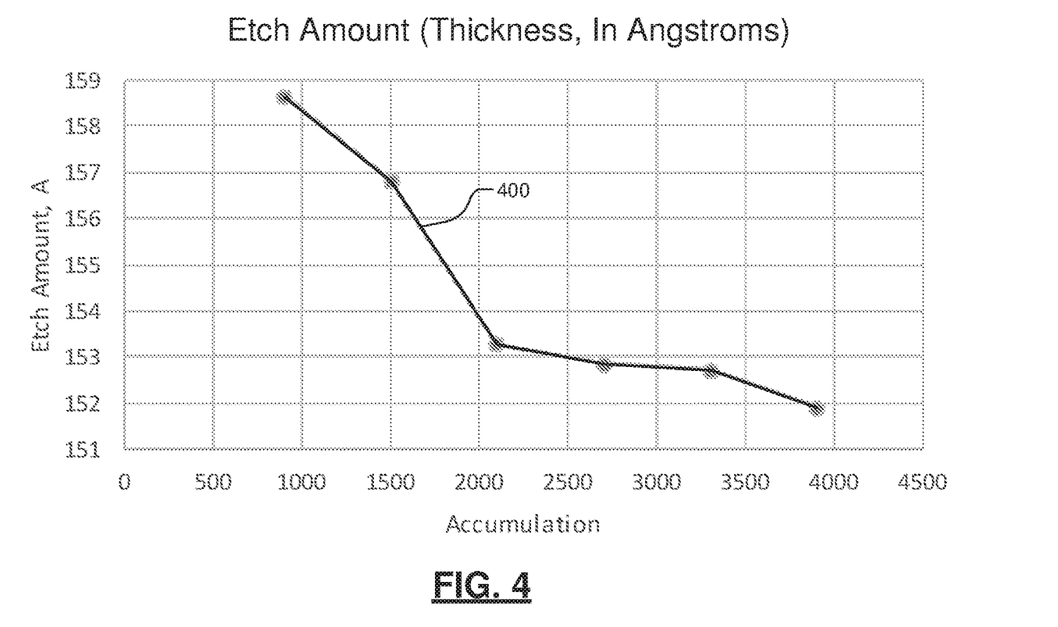
FIG. 4 shows an example decrease of etch amount as accumulation of material in a processing chamber increases according to the present disclosure.
Figure 5:
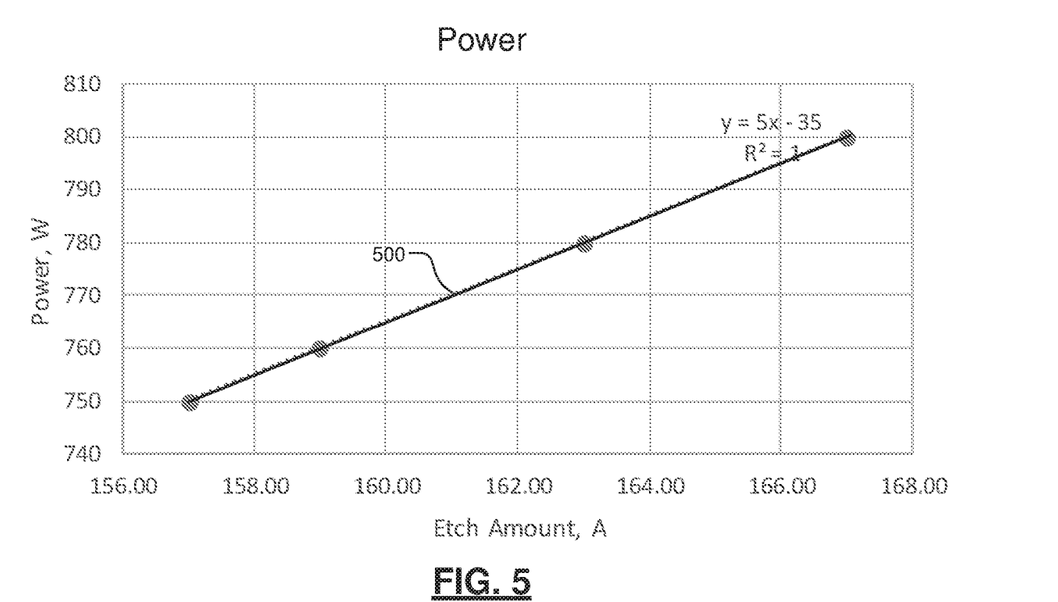
FIG. 5 shows an example of radio frequency (RF) power relative to etch amount according to the present disclosure.

Various non-uniformities affect an amount of material deposited (e.g., during ALD steps) and removed (e.g., during etching steps) during processing. For example, deposition of the spacer layer 308 as shown in FIG. 3C and etching of the mandrels 304 during the trim step as shown in FIG. 3B cause material to be deposited on surfaces (e.g., on inner walls) of the processing chamber. Accumulation of this deposited material changes the impedance of the processing chamber and etch rates during subsequent etch steps, causing WtW variability of the trim step. FIG. 4 shows an example decrease of an etch amount 400 (e.g., for a trim step of a predetermined duration, in Angstroms) as accumulation of material in a processing chamber increases. As shown, the accumulation is measured in a number of trim/deposition cycles relative to a last time the processing chamber was cleaned. FIG. 5 shows a graph of RF power 500 (e.g., RF power provided during a trim step) relative to the etch amount. As shown, the etch amount increases as the RF power 500 increases. In this example, the increase is generally linear (e.g., as shown, power y=5x−35, where, x corresponds to the etch amount).

Figure 6:
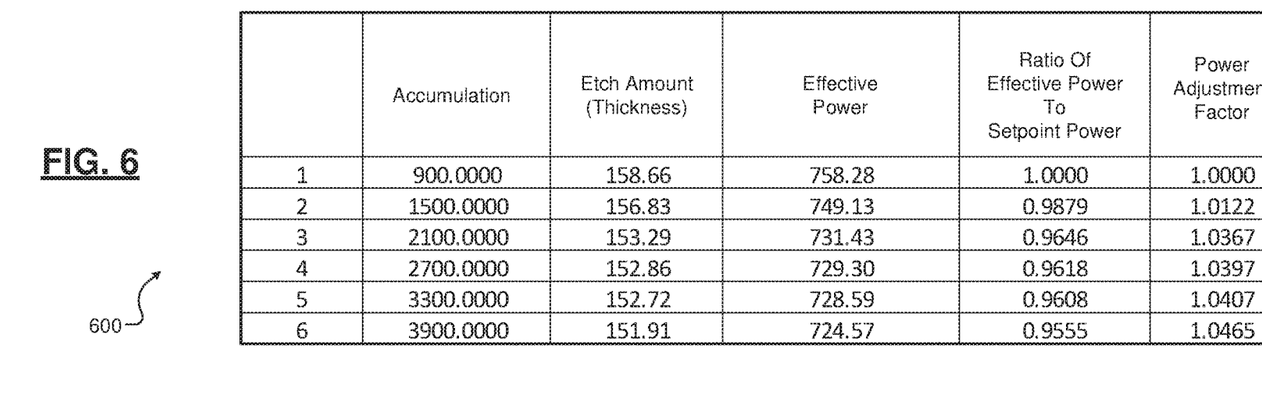
FIG. 6 is a table showing example changes in etch amount and effective power as accumulation in a processing chamber increases according to the present disclosure.

Referring now to FIG. 6, a table 600 shows example changes in etch amount (e.g., for a respective trim step of a predetermined period) and effective power as accumulation increases. As shown, as accumulation increases (e.g., from 900 trim/deposition cycles to 3900 trim/deposition cycles), the etch amount for a trim step of a predetermined period decreases from 158.66 Angstroms to 151.91 Angstroms and effective power decreases from 758.28 watts to 724.57 watts. Accordingly, as accumulation increases and causes the impedance of the process chamber to change, the effective power decreases. In other words, the effective power is less than a desired (e.g., setpoint) power. A ratio of effective power to setpoint power decreases from an ideal ratio of 1.0000 to 0.9555.

The controller 182 according to the present disclosure is configured to increase the setpoint power (e.g., increase the RF power from a predetermined default setpoint to an adjusted RF power) based on the accumulation. For example, the setpoint power is adjusted in accordance with a power adjustment factor. When accumulation is low (e.g., less than 900), the power adjustment factor is 1.0000. In other words, adjusting the setpoint power may not be necessary when accumulation is low. In contrast, as accumulation increases, the power adjustment factor increases from 1.0000 to 1.0465. For example, if the desired setpoint power is 758.28 watts, at an accumulation of 3900 the setpoint power is adjusted according to 1.0465*758.28=793.5400 watts. At the ratio of effective power to setpoint power for an accumulation of 3900, the effective power for a setpoint power of 793.5400 corresponds to 793.5400*0.9555, or 758.23 watts. Accordingly, the setpoint power is increased in accordance with the power adjustment factor as accumulation increases such that the effective power is maintained at the desired predetermined setpoint power.

Figure 7:
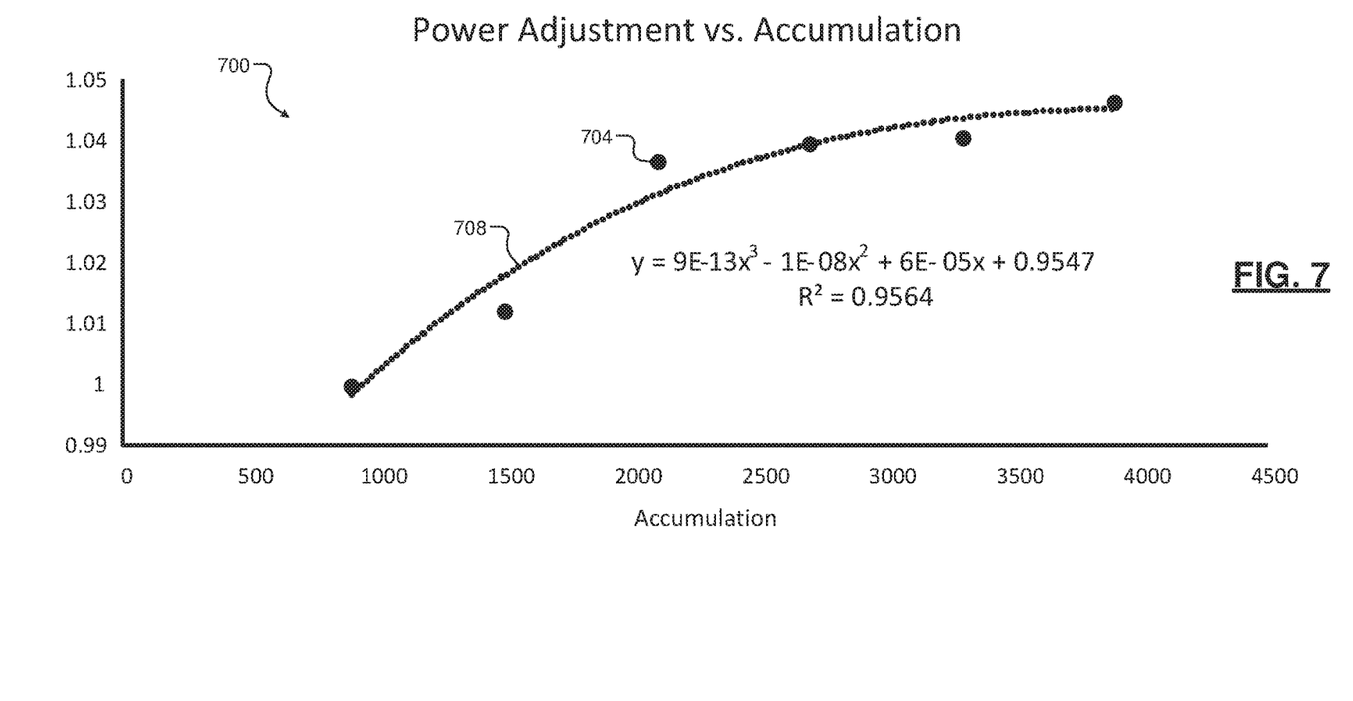
FIG. 7 shows an example plot of calculated power adjustment factors at various accumulation values according to the present disclosure.

FIG. 7 shows an example plot 700 of calculated power adjustment factors (e.g., as indicated by graph points 704) at various accumulation values. In some examples, the power adjustment factors may be fit to a curve 708, which is represented as a formula. In one example, the curve 708 is represented as a $3^{rd}$ degree polynomial. The controller 182 is configured to calculate an adjusted setpoint power based on the accumulation, the desired setpoint power (e.g., as received as an input from a user, a process recipe, etc.), and the formula. In other examples, the controller 182 may store data (e.g., a lookup table) correlating a plurality of accumulation values to respective power adjustment factors.

Figure 8:
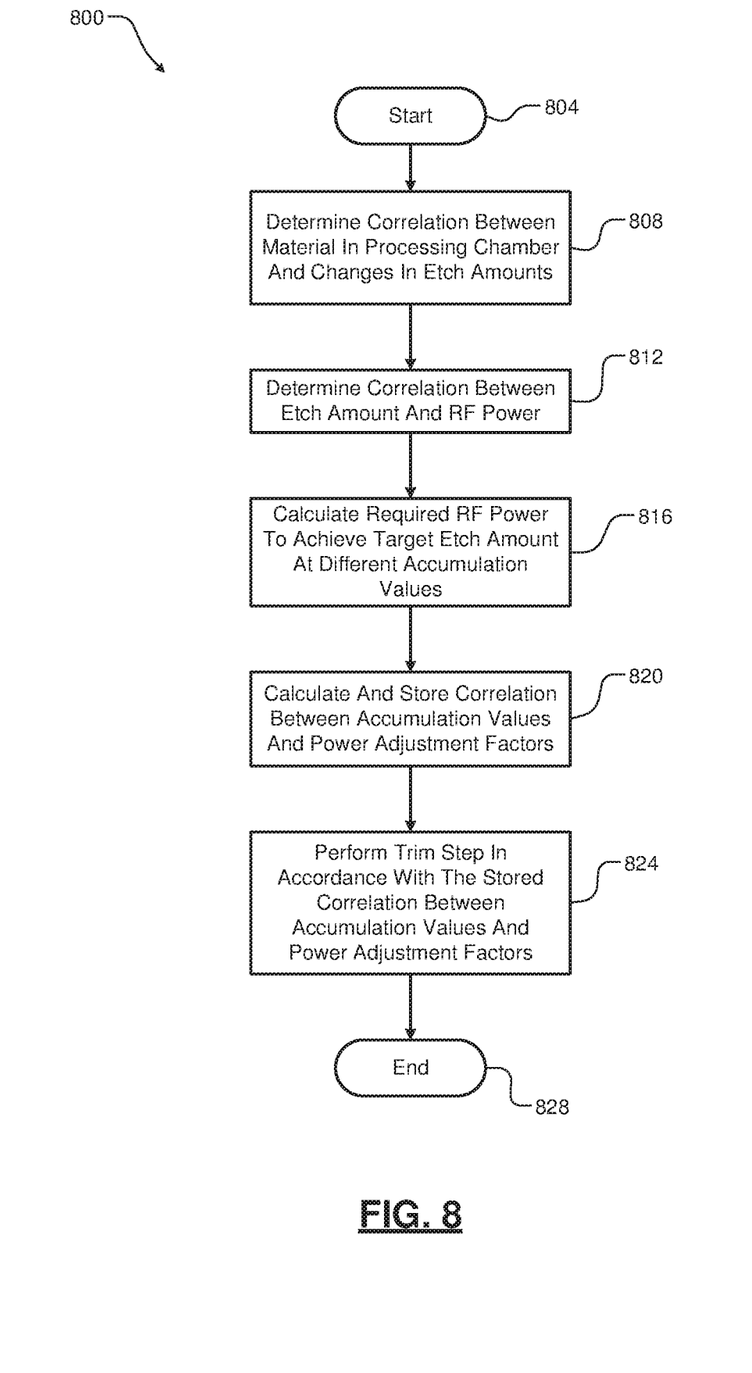
FIG. 8 is an example method an example method for compensating for accumulation in a processing chamber to minimize wafer-to-wafer (WtW) variability in a trim step according to the present disclosure.

Referring now to FIG. 8, an example method 800 for compensating for accumulation in a processing chamber to minimize wafer-to-wafer (WtW) variability in a trim step begins at 804. At 808, the method 800 determines a correlation between an increase in accumulation of material within a processing chamber (and a corresponding change in an impedance of the processing chamber) and changes in etch amounts for a given trim step. For example, the method 800 collects and stores first data indicating a correlation between a decrease in the etch amount (e.g., in Angstroms)

and an increase in the accumulation (e.g., as measured in trim/deposition cycles, where one cycle corresponds to one trim step followed by one spacer layer deposition step, since a last time the processing chamber was cleaned). In other examples, accumulation may be measured in another manner (e.g., a total duration of etching and deposition performed within the processing chamber since a last time the processing chamber was cleaned, a total number of substrates processed since a last time the processing chamber was cleaned, an amount of time that has elapsed since a last time the processing chamber was cleaned, etc.). For example only, the collected first data corresponds to the accumulation and etch amount shown in FIG. 6.

At 812, the method 800 determines a correlation between etch amount and RF power. For example, the method 800 collects and stores second data indicating correlations between changes in RF power provided during a trim step and corresponding changes in etch amount. For example only, the collected second data may correspond to the graph of RF power 500 relative to the etch amount as shown in FIG. 5. Generally, increasing RF power increases the etch amount while decreasing RF power decreases the etch amount.

At 816, the method 800 uses the collected first data and second data to calculate a required RF power to achieve a target etch amount at different accumulation values. For example, the method 800 calculates the effective power, a ratio of the effective power to a setpoint power, and a power adjustment factor (e.g., a ratio of RF power required to compensate for the accumulation to the setpoint power) for a given accumulation value as described above with respect to FIG. 6. At 820, the method 800 uses the power adjustment factor to calculate and store a correlation between various accumulation values and corresponding power adjustment factors. For example, the correlation between the accumulation values and power adjustment factors may correspond to the plot 700 as shown in FIG. 7, a formula such as a polynomial representing the curve 708, etc. For example only, the controller 182 may store the formula.

At 824, the method 800 performs a trim step in accordance with the stored correlation between the accumulation values and power adjustment factors. For example, prior to the trim step, the method 800 (e.g., the controller 182) determines the accumulation, determines the power adjustment factor in accordance with the accumulation and the stored formula, adjusts a desired setpoint power using the power adjustment factor, and performs the trim step using the setpoint power as adjusted by the power adjustment factor. The method 800 ends at 828.

Figure 9:
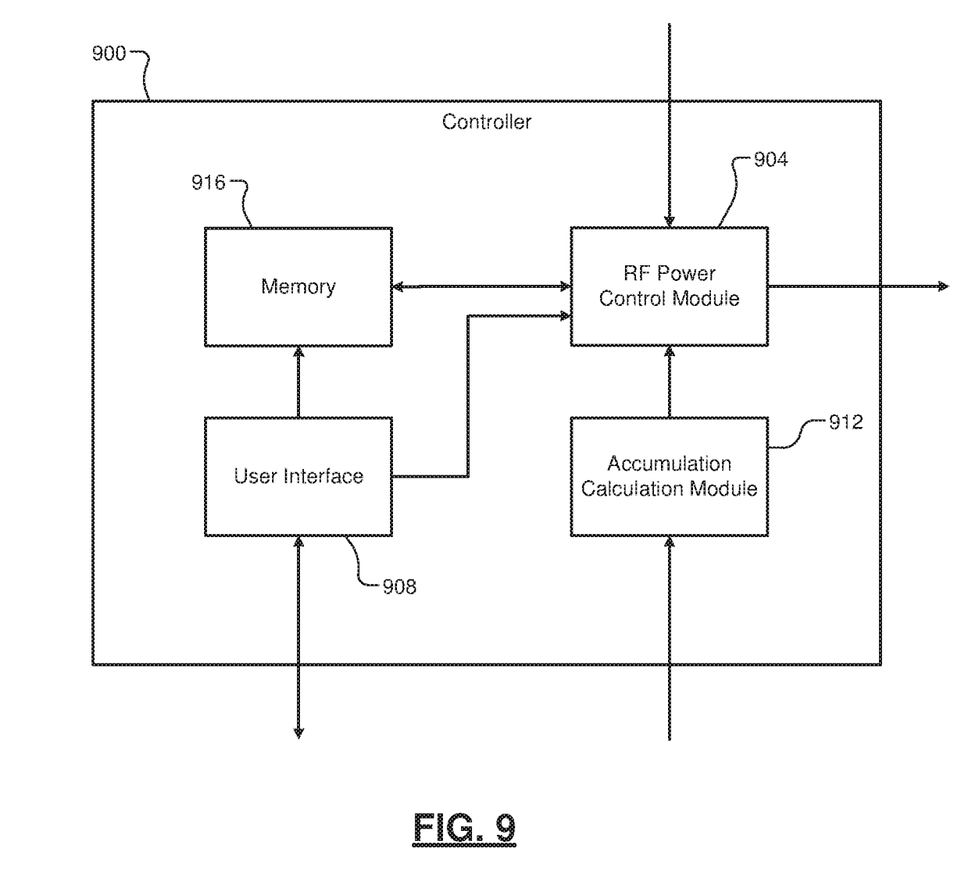
FIG. 9 is an example controller configured to compensate for accumulation in a processing chamber according to the present disclosure.

Referring now to FIG. 9, an example controller 900 configured to compensate for accumulation in a processing chamber according to the present disclosure is shown. The controller 900 includes an RF power control module 904 that controls an amount and duration of RF power provided during a trim step according to the present disclosure. For example, the RF power control module 904 selectively provides a signal to the RF generating system 188 to selectively turn on and turn off RF power and to adjust an amount of power generated by the RF generating system 188.

The RF power control module 904 receives a desired setpoint power (e.g., based on a process recipe being executed by the controller 900, from a user interface 908, etc.) and an accumulation value (e.g., from an accumulation calculation module 912 configured to determine accumulation within the processing chamber as described above) and retrieves stored data from memory 916. For example, the stored data corresponds to a formula indicating a correlation between various accumulation values and corresponding power adjustment factors. The RF power control module 904 calculates an adjusted RF power based on the determined accumulation, the setpoint power, and the retrieved data and controls the RF generating system 188 accordingly.

In another example, the controller 900 may be configured to adjust a duration of the trim step instead of and/or in addition to adjusting the amount of RF power to compensate for the reduced etch rate caused by accumulation within the processing chamber. In particular, the duration of the trim step may be increased to compensate for the reduced etch rate. For example, the RF power control module 904 receives the desired setpoint power, a duration of the trim step, and the accumulation value and retrieves stored data from memory 916 indicating a correlation between various accumulation values and corresponding trim step duration adjustment factors. In an example where a process recipe indicates a trim step duration D, the RF power control module 904 is configured to adjust the duration D in accordance with an adjusted duration $D_{adj}$=(duration adjustment factor)*D. For example, the duration adjustment factor may be calculated based on the accumulation value in accordance with a formula correlating various accumulation values and corresponding duration adjustment factors in a manner similar to the calculation of the power adjustment factor as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A controller, comprising:
   memory that stores data correlating accumulation values to respective adjustment factors, wherein the accumulation values correspond to accumulation of material on surfaces within a processing chamber configured to perform etching and deposition on a substrate, and wherein the respective adjustment factors correspond to adjustments to a control parameter of radio frequency (RF) power provided to the processing chamber while performing an etching step of a patterning process;
   an accumulation calculation module configured to calculate a first accumulation value indicating an amount of accumulation of the material; and
   an RF power control module configured to
      receive the first accumulation value,
      receive at least one of a setpoint power to be provided during an etching step and a duration of the etching step,
      retrieve the stored data from memory,
      adjust the control parameter based on the first accumulation value, the at least one of the setpoint power and the duration of the etching step, and the stored data, and
      control the RF power provided to the processing chamber during the etching step in accordance with the control parameter as adjusted.

2. The controller of claim 1, wherein the control parameter is a magnitude of the RF power, and wherein the RF power control module is configured to determine a first adjustment factor corresponding to the first accumulation value using the stored data and adjust the magnitude of the RF power in accordance with the first adjustment factor.

3. The controller of claim 2, wherein the stored data is a polynomial correlating the accumulation values to the respective adjustment factors.

4. The controller of claim 2, wherein the first adjustment factor is a ratio of (i) a magnitude of an RF power required to compensate for the accumulation to (ii) the setpoint power.

5. The controller of claim 2, wherein the RF power control module is configured to multiply the setpoint power by the first adjustment factor to adjust the control parameter.

6. The controller of claim 1, wherein the accumulation calculation module is configured to calculate the first accumulation value based on at least one of a number of etching steps performed within the processing chamber, a number of cycles of etching steps and deposition steps performed within the processing chamber, a total duration of etching steps and deposition steps performed within the processing chamber, and a number of substrates processed within the processing chamber.

7. The controller of claim 1, wherein the control parameter is the duration of the etching step, and wherein the RF power control module is configured to determine a first adjustment factor corresponding to the first accumulation value using the stored data and adjust the duration of the etching step in accordance with the first adjustment factor.

8. The controller of claim 7, wherein the first adjustment factor corresponds to an amount to increase the duration of the etching step to compensate for the accumulation.

9. The controller of claim 7, wherein the RF power control module is configured to multiply the duration of the etching step by the first adjustment factor to adjust the control parameter.

10. The controller of claim 7, wherein the etching step is a trim step.

11. A system comprising the controller of claim 10, wherein the controller is further configured to perform a spacer layer deposition step within the processing chamber subsequent to the trim step.

* * * * *